United States Patent
Jeong et al.

(10) Patent No.: US 10,840,271 B2
(45) Date of Patent: Nov. 17, 2020

(54) ULTRA HIGH DENSITY THIN FILM TRANSISTOR SUBSTRATE HAVING LOW LINE RESISTANCE STRUCTURE AND METHOD FOR MANUFACTURING THE SAME

(71) Applicant: LG Display Co., Ltd., Seoul (KR)

(72) Inventors: Youngmin Jeong, Paju-si (KR); Seunghwan Shin, Jeonju-si (KR); Daeyoung Seo, Incheon (KR); Soyoung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 3 days.

(21) Appl. No.: 16/235,639

(22) Filed: Dec. 28, 2018

(65) Prior Publication Data

US 2019/0139989 A1    May 9, 2019

Related U.S. Application Data

(60) Continuation of application No. 15/801,120, filed on Nov. 1, 2017, now Pat. No. 10,204,930, which is a
(Continued)

(30) Foreign Application Priority Data

Jul. 15, 2015    (KR) .................. 10-2015-0100406

(51) Int. Cl.
   *H01L 27/12*    (2006.01)
   *G02F 1/1362*    (2006.01)
   *G02F 1/1343*    (2006.01)

(52) U.S. Cl.
   CPC ...... *H01L 27/124* (2013.01); *G02F 1/136286* (2013.01); *H01L 27/1237* (2013.01);
   (Continued)

(58) Field of Classification Search
   CPC ..... H01L 27/12; H01L 27/124; H01L 27/123; H01L 27/125; H01L 27/126;
   (Continued)

(56) References Cited

U.S. PATENT DOCUMENTS 5,107,355 A    4/1992  Satoh et al.
6,204,520 B1   3/2001  Ha et al.
(Continued)

OTHER PUBLICATIONS

European Extended Search Report, European Application No. 15202913.8, dated Nov. 21, 2016, 10 pages.
(Continued)

*Primary Examiner* — Fazli Erdem
(74) *Attorney, Agent, or Firm* — Fenwick & West LLP

(57) ABSTRACT

A display device is described that has reduced resistance in one or more of the gate, common, data electrical lines that control the operation of the pixels of the display device. Reduced resistance is achieved by forming additional metal and/or metal-alloy layers on the gate, common, and/or data lines in such a manner so that the cross-sectional area of those lines is increased. As a consequence, each such line is formed so as to be thicker than could otherwise be achieving without causing defects in the rubbing process of an alignment layer. Additionally, no widening of these lines is needed, thus preserving the aspect ratio of the device. The gate insulating and semiconducting layers that in part make up the thin film transistors that help control the operation of the pixels of the device may also be designed to take into account the increased thickness of the lines.

16 Claims, 6 Drawing Sheets

Related U.S. Application Data division of application No. 14/953,764, filed on Nov. 30, 2015, now Pat. No. 9,837,444.

(52) U.S. Cl.
CPC ...... *H01L 27/1259* (2013.01); *H01L 27/1262* (2013.01); *H01L 27/1288* (2013.01); *G02F 1/134363* (2013.01); *G02F 2001/13629* (2013.01); *G02F 2001/136295* (2013.01); *G02F 2201/40* (2013.01)

(58) Field of Classification Search
CPC ............... H01L 27/128; H01L 27/1237; H01L 27/1259; H01L 27/1262; H01L 27/1288
USPC ..................................................... 257/59, 72
See application file for complete search history.

(56) References Cited

U.S. PATENT DOCUMENTS

| | | |
|---|---|---|
| 2007/0258035 A1 | 11/2007 | Wang et al. |
| 2009/0135102 A1 | 5/2009 | Park |
| 2009/0135103 A1 | 5/2009 | Kim |
| 2009/0135104 A1 | 5/2009 | Jeong |
| 2009/0184324 A1 | 7/2009 | Oh et al. |
| 2009/0267087 A1 | 10/2009 | Yang et al. |
| 2012/0007091 A1* | 1/2012 | Lee ...................... H01L 27/124 257/60 |
| 2012/0286298 A1 | 11/2012 | Pang et al. |
| 2013/0105826 A1* | 5/2013 | Lee ...................... H01L 27/124 257/88 |
| 2016/0149155 A1 | 5/2016 | Kim |

OTHER PUBLICATIONS

United States Office Action, U.S. Appl. No. 14/953,764, dated Mar. 7, 2017, 9 pages.
United States Office Action, U.S. Appl. No. 14/953,764, dated Sep. 15, 2016, 8 pages.
United States Office Action, U.S. Appl. No. 15/801,120, dated Feb. 28, 2018, 7 pages.
United States Office Action, U.S. Appl. No. 15/801,120, dated May 31, 2018, 7 pages.

* cited by examiner

ULTRA HIGH DENSITY THIN FILM TRANSISTOR SUBSTRATE HAVING LOW LINE RESISTANCE STRUCTURE AND METHOD FOR MANUFACTURING THE SAME

CROSS-REFERENCE TO RELATED APPLICATIONS

This application is a continuation of U.S. application Ser. No. 15/801,120 filed on Nov. 1, 2017, which is a divisional of U.S. application Ser. No. 14/953,764 filed on Nov. 30, 2015, now U.S. Pat. No. 9,837,444, issued Dec. 5, 2017, which claims the benefit of Korea Patent Application No. 10-2015-0100406 filed on Jul. 15, 2015, all of which are incorporated herein by reference for all purposes as if fully set forth herein.

BACKGROUND OF THE INVENTION

Field of the Invention

The present disclosure relates to an ultra high density thin film transistor (or "TFT") substrate having low resistance bus line structure and a method for manufacturing the same. Especially, the present disclosure relates to an ultra high density TFT substrate having double-thick bus lines by forming the double layered gate line and data line to have low resistance bus line structure and a method for manufacturing the same.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or ED).

The flat panel display devices such as the liquid crystal display device or the organic light emitting diode display device have the substrate including a plurality of TFTs for using as the active display devices. FIG. 1 is a plane view illustrating the structure of the thin film transistor substrate used in the horizontal electric field type liquid crystal display device according to the related art. FIGS. 2A to 2E are cross-sectional views illustrating the steps of manufacturing for the thin film transistor substrate of FIG. 1 by cutting along the line I-I', according to the related art.

Referring to FIG. 1 and FIGS. 2A to 2E, the thin film transistor substrate of the LCD has a gate line GL and a data line DL crossing each other with a gate insulating layer GI therebetween on a glass substrate SUB, and a thin film transistor TFT formed at each cross section of the gate line GL and the data line DL. The crossing structure of the gate line GL and the data line DL defines a pixel area. Further included are a pixel electrode PXL and a common electrode COM for forming a horizontal electric field therebetween in the pixel area, and a common line CL connected to the common electrode COM on the substrate SUB. The gate line GL supplies the gate signal to the gate electrode G of the thin film transistor TFT. The data line DL supplies the pixel signal to the pixel electrode PXL via the drain electrode D of the thin film transistor TFT. The common line CL is formed in parallel with the gate line GL between the pixel areas and supplies a reference voltage for driving the liquid crystal to the common electrode COM.

Responding to the gate signal supplied to the gate line GL, the thin film transistor TFT can charge the pixel signal from the data line DL to pixel electrode PXL, and maintain the pixel signal on the pixel electrode PXL. The pixel electrode PXL is formed within the pixel area by being connected to the drain electrode D of the thin film transistor TFT. The common electrode COM is also formed within the pixel area by being connected to the common line CL. Especially, the pixel electrode PXL and the common electrode COM are disposed in parallel each other in the pixel area. For example, the common electrode COM has a plurality of vertical segments which are separately disposed with a predetermined distance each other. The pixel electrode PXL has a plurality of vertical segments in which each segments is disposed between the segments of the common electrode COM.

At one end portion of each gate line GL and each data line DL, a gate pad GP and a data pad DP are formed, respectively. The gate pad GP and the data pad DP are connected to a gate pad terminal GPT and a data pad terminal DPT through a gate pad contact hole GPH and a data pad contact hole DPH, respectively.

Referring to FIGS. 2A to 2E again, the method for manufacturing the thin film transistor substrate according to the related art will be explained, hereinafter.

A gate metal is deposited on a substrate SUB. The gate elements are formed by patterning the gate metal using the first mask process. As shown in FIG. 2A, the gate elements include a plurality of gate line GL running in horizontal direction, the gate electrode G branching from the gate line GL, and a gate pad GP formed at one end of the gate line GL. As the thin film transistor substrate is for the horizontal electric field type, the common line CL disposed in parallel to the gate line GL is further included.

A gate insulating layer GI such as silicon nitride (SiNx) or silicon oxide (SiOx) is deposited on the whole surface of the substrate SUB having the gate elements. After that, a semiconductor material such as amorphous silicon and an impurity doped semiconductor material such as n+ doped silicon are sequentially deposited thereon. By patterning the impurity doped semiconductor material and the semiconductor material using the second mask process, a semiconductor channel layer A and an ohmic layer n are formed, as shown in FIG. 2B. The semiconductor channel layer A and the ohmic layer n are formed to be overlapped with the gate electrode G having the gate insulating layer GI therebetween.

On the substrate SUB having the semiconductor channel layer A and the ohmic layer n, a source-drain metal is deposited. By patterning the source-drain metal using the third mask process, the source-drain elements are formed. As shown in FIG. 2C, the source-drain elements include the data line DL running in vertical direction to cross with the gate line GL, a data pad DP formed at one end of the data line DL, the source electrode S branching from the data line DL and overlapping with one side of the gate electrode G, and the drain electrode D facing with the source electrode S and overlapping with the other side of the gate electrode G. Especially, the source electrode S contacts one portion of the ohmic layer n to overlap with one side of the semiconductor channel layer A and the gate electrode G. The drain electrode D contacts anther portion of the ohmic layer n to overlap with the other side of the semiconductor channel layer A and the gate electrode G. Further etching the ohmic layer n' using the source-drain elements as a mask, the portions of the ohmic layer n' exposed between the source electrode S and the drain electrode D are removed so that the semiconductor channel layer A is exposed between the source electrode S and the drain electrode D. Consequently, the thin film transistor TFT including the source electrode S, the drain electrode D, the semiconductor channel layer A, and the gate electrode G is completed.

On the whole surface of the substrate SUB having the source-drain elements, a passivation layer PAS is formed by depositing an insulating material such as silicon nitride (SiNx) or silicon oxide (SiOx). As shown in FIG. 2D, by patterning the passivation layer PAS using the fourth mask process, a data pad contact hole DPH exposing some portions of the data pad DP and the drain contact hole DH exposing some portions of the drain electrode D are formed. At the same time, by patterning the passivation layer PAS and the gate insulating layer GI, a gate pad contact hole GPH exposing some portions of the gate pad GP and a common contact hole CH exposing some portions of the common line CL are formed.

On the passivation layer PAS having the contact holes GPH, DH, DPH and CH, a transparent conductive material such as ITO (Indium Tin Oxide) or IZO (Indium Zinc Oxide) is deposited. By patterning the transparent conductive material using the fifth mask process, the pixel electrode PXL, the common electrode COM, the gate pad terminal GPT and the data pad terminal DPT are formed, as shown in FIG. 2D. The pixel electrode PXL contacts the drain electrode D through the drain contact hole DH, and has a plurality of segments disposed in parallel within the pixel area. The common electrode COM contacts the common line CL through the common contact hole CH, and has a plurality of segments disposed in parallel within the pixel area. The pixel electrode PXL and the common electrode COM are disposed in parallel each other with a predetermined distance. The gate pad terminal GPT contacts the gate pad GP through the gate pad contact hole GPH, and the data pad terminal DPT contacts the data pad DP through the data pad contact hole DPH.

The LCD according to the related art explained above has a problem to have a large display area. Typically, as the area of the thin film transistor substrate is getting larger, the gate line and the data line should be getting longer and longer. As the bus lines are getting longer and longer, even though the resistivity of the bus line material is not changed because it is the property of the material, the resistance of the bus line is getting larger and larger. The resistance of the bus line is defined by the following Equation 1.

$$R = \rho \frac{L}{S} \quad \text{[Equation 1]}$$

Here, R is the resistance of the bus line, $\rho$ is the resistivity of the bus line (such as the gate line GL (or gate bus line) and the data line DL (or data bus line)) material, L is the length of the bus line, and S is the cross-sectional area of the bus line.

That is, as the thin film transistor substrate is getting larger, the length L will be longer so that the resistance is getting higher. As the resistance is getting higher, the signal passing through the bus line can be delayed. As a result, the display device has the video quality problems. To solve these problems, the resistance of the bus line should be reduced. To make the resistance of the bus line in lower state, the cross-sectional may be increased, or the bus line material can be selected as having a lower resistivity. To select a material having a lower resistivity is very difficult because the material is limited. Furthermore, even it is possible, when the bus line is further getting longer and longer, the resistance will be higher again. Therefore, the best solution to make the resistance of the bus line be in low is to enlarge the cross-sectional area of the bus line.

In order to increase the cross-sectional area of the bus line, there may be two methods; one is to increase the width of the bus line, the other is to increase the thickness of the bus line. For one example, by enlarging the width of the gate bus line and/or data bus line, it is possible to prevent the resistance of the bus line from being increased. However, as the width of the bus lines defining the boundaries of the pixel area is also increased, the effective pixel area should be reduced. In that case, the aperture ratio of the display area is also reduced and it causes another reason of defected display quality. For another example, by enlarging the thickness of the bus lines, the etching tact time should be longer and longer when forming the bus lines and the space between the bus lines should be increased, so that it can cause the problem of lowered aperture ratio. Furthermore, as increasing the thickness of the bus line, the step difference between the bus line and other layer can be enlarged so that it causes the defects at rubbing process of the alignment layer.

Consequently, in the thin film transistor substrate for the large diagonal area flat panel display device, the bus line structure ensuring the low resistance of the bus line is one of the important requirements.

SUMMARY OF THE INVENTION

In order to overcome the above mentioned drawbacks, the purpose of the present disclosure is to suggest an ultra high density thin film transistor substrate having a low resistance bus line structure for large area and ultra high density flat panel display device and a method for manufacturing the same. Another purpose of the present disclosure is to suggest an ultra high density thin film transistor substrate having a low resistance bus line structure in which the line resistance is not increased even though the width of the line is being narrowed because that the thickness of the bus line is being thicker and a method for manufacturing the same. Still another purpose of the present disclosure is to suggest an ultra high density thin film transistor substrate having a low resistance bus line structure in which the bus line has the double layered structure as having good uniformity of the bus line layers and double the thickness. Yet another purpose of the present disclosure is to suggest an ultra high density thin film transistor substrate having a low resistance bus line structure and a method for manufacturing the same without increasing the complexity of the manufacturing steps and the tack time for the manufacturing, just by adding additional bus lines stacked on the bus line.

In one embodiment, a display device comprises a gate line, a common line, and an additional data line (ADL) formed on a substrate. A gate insulating layer is formed on a portion of the gate line and on a portion of the ADL. A semiconductor layer is formed on at least a portion of the gate insulating layer. A data line is formed on a portion of the ADL not covered by the gate insulating layer. An additional gate line (AGL) is formed on a portion of the gate line not covered by the gate insulating layer. An additional common line (ACL) formed on the common line. The display device includes a comprising a gate coupled to the gate line, a source coupled to the data line, a drain, and a portion of the semiconductor layer at least partially located between the source and the drain.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
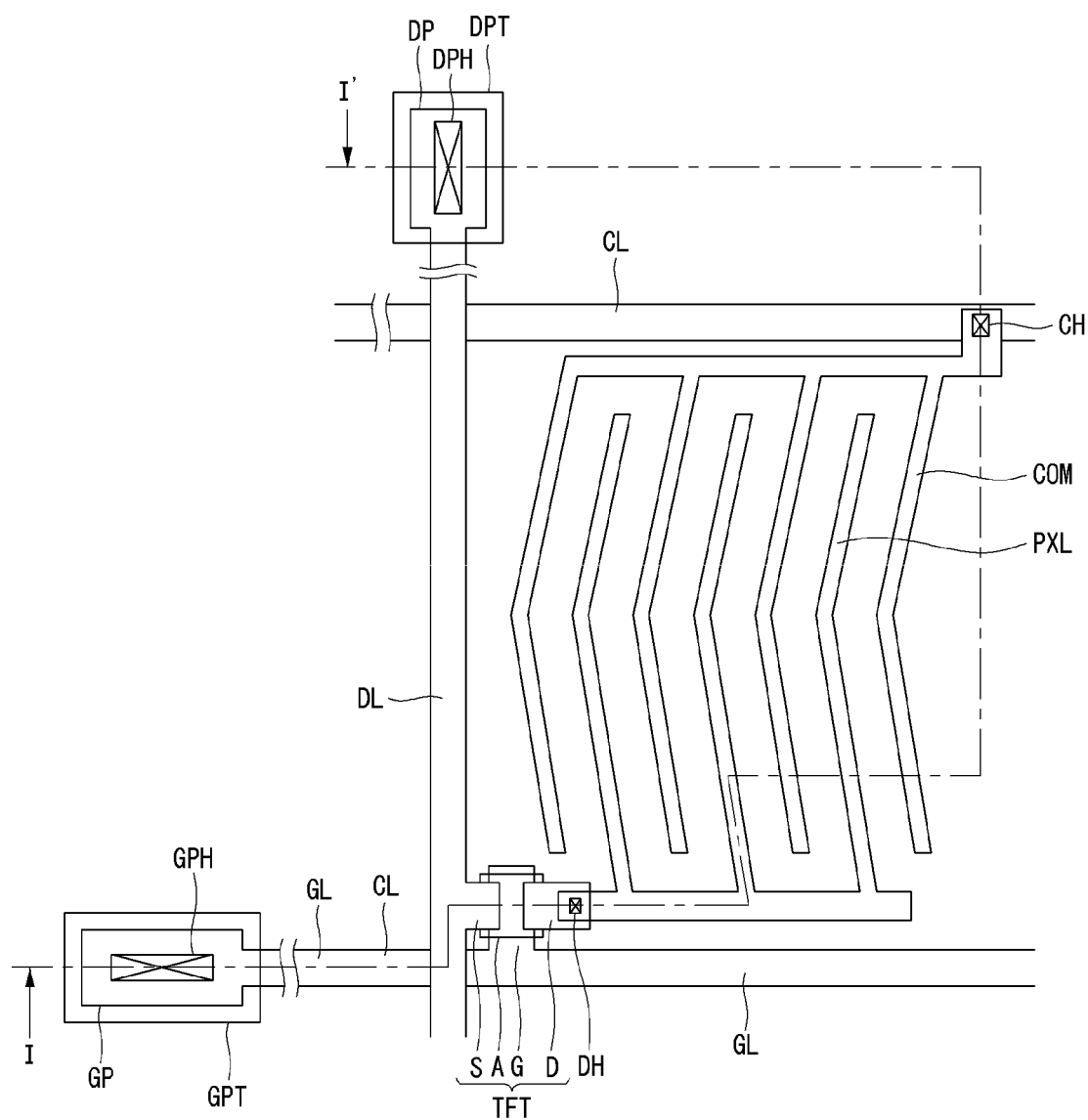
FIG. 1 is a plane view illustrating the structure of the thin film transistor substrate used in the horizontal electric field type liquid crystal display device according to the related art.
Figure 2A:
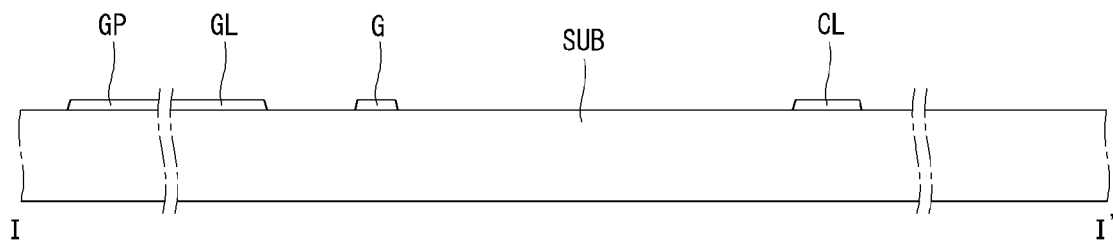
FIGS. 2A to 2E are cross-sectional views illustrating the steps of manufacturing for the thin film transistor substrate of FIG. 1 by cutting along the line I-I', according to the related art.
Figure 2B:
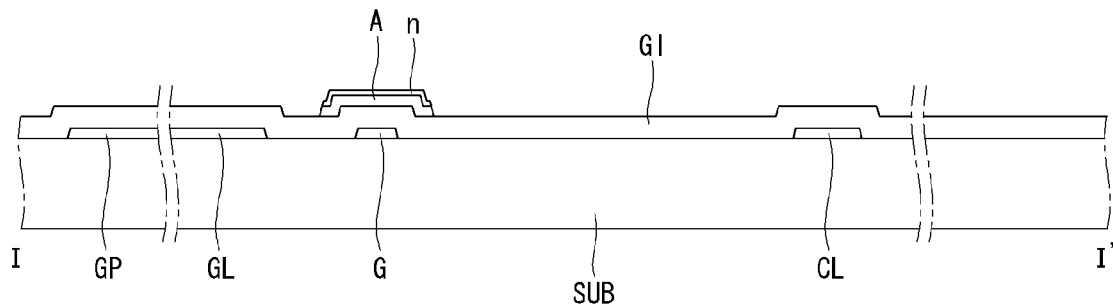
Figure 2C:
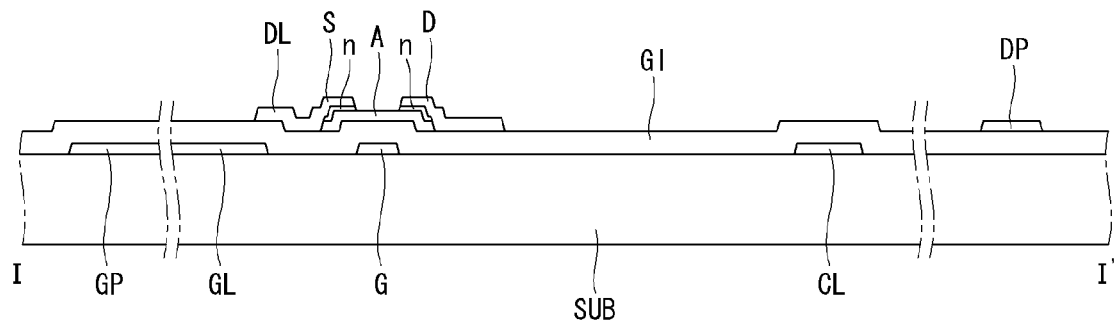
Figure 2D:
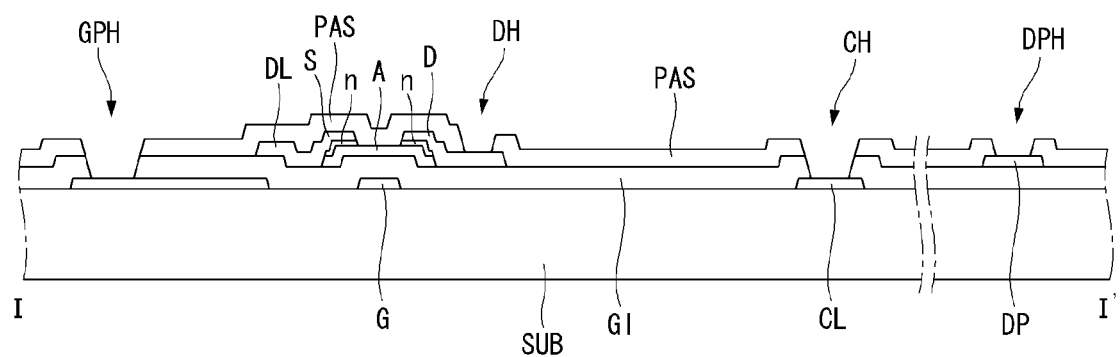
Figure 2E:
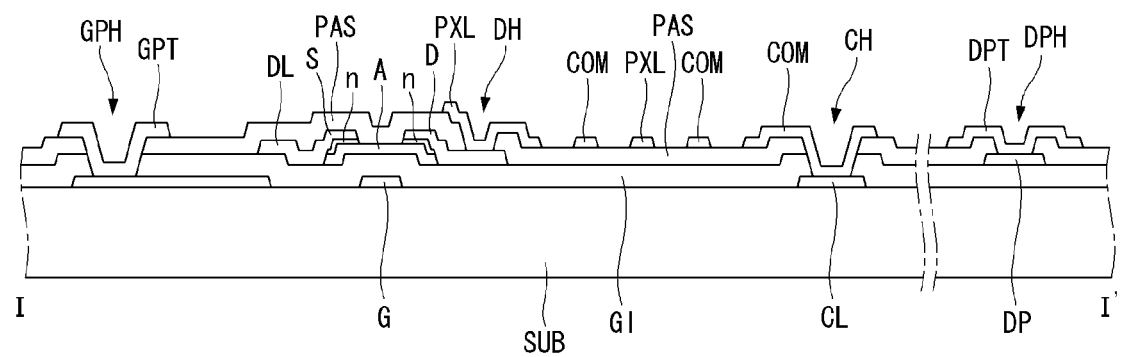

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 3:
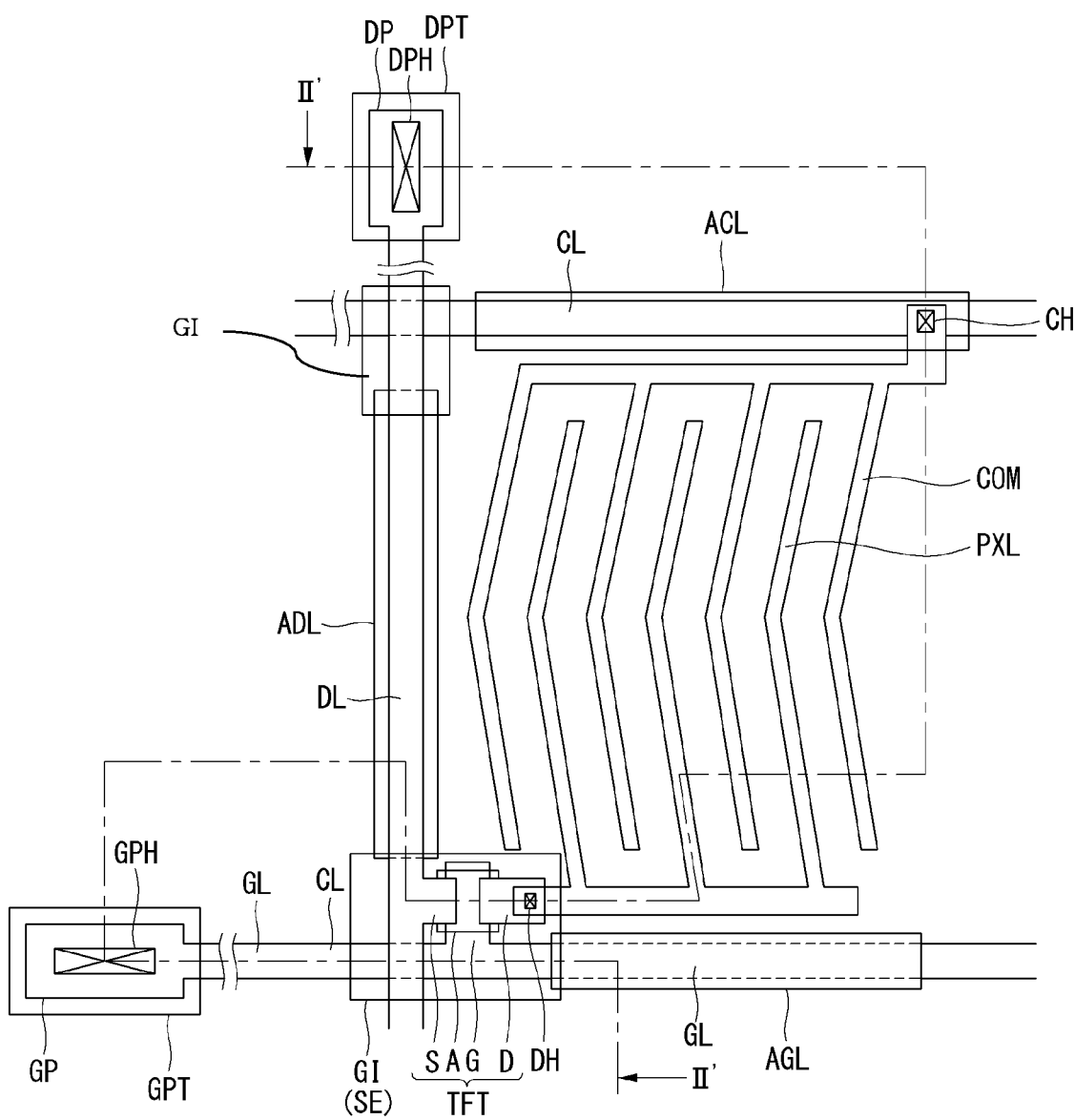
FIG. 3 is a plane view illustrating the structure of the ultra high density thin film transistor substrate used in the large area horizontal electric field type liquid crystal display according to the present disclosure.

Hereinafter, referring to attached figures including FIG. 3 and FIGS. 4A to 4E, we will explain preferred embodiments of the present disclosure. FIG. 3 is a plane view illustrating the structure of the ultra high density thin film transistor substrate used in the large area horizontal electric field type liquid crystal display according to the present disclosure. FIGS. 4A to 4E are cross-sectional views illustrating the steps of manufacturing for the ultra high density thin film transistor substrate of FIG. 1 by cutting along the line II-II', according to the present disclosure.

Referring to FIG. 3 and FIGS. 4A to 4E, the thin film transistor substrate for an LCD comprises a gate line GL and a data line DL which are crossing each other with a gate insulating layer therebetween on a glass substrate SUB, and a thin film transistor T formed at the crossing portion of the gate line GL and the data line DL. The crossing gate line GL and the data line DL defines a pixel area. Further included are a pixel electrode PXL and a common electrode COM for forming a horizontal electric field therebetween in the pixel area, and a common line CL connected to the common electrode COM on the substrate SUB. The gate line GL supplies the gate signal to the gate electrode G of the thin film transistor T. The data line DL supplies the pixel signal to the pixel electrode PXL via the drain electrode D of the thin film transistor T. The common line CL is formed between the pixel areas, is parallel with the gate line GL, and supplies a reference voltage signal for driving the liquid crystal molecules to the common electrode COM.

Responding to the gate signal supplied to the gate line GL, the thin film transistor T can charge the pixel signal from the data line DL to pixel electrode PXL, and maintain the pixel signal on the pixel electrode PXL. The pixel electrode PXL is formed within the pixel area by being connected to the drain electrode D of the thin film transistor T. The common electrode COM is also formed within the pixel area by being connected to the common line CL. Especially, the pixel electrode PXL and the common electrode COM are disposed in parallel each other in the pixel area. For example, the common electrode COM has a plurality of vertical segments (or vertical chevron segments) which are separately disposed with a predetermined distance each other. The pixel electrode PXL has a plurality of vertical segments (or vertical chevron segments) in which each segments is disposed between the segments of the common electrode COM.

At one end portion of each gate line GL and each data line DL, a gate pad GP and a data pad DP are formed, respectively. The gate pad GP and the data pad DP are connected to a gate pad terminal GPT and a data pad terminal DPT through a gate pad contact hole GPH and a data pad contact hole DPH, respectively.

In the present disclosure, in order to reduce the resistance of the gate line GL and the common line CL and to prevent the aperture ratio from being lowered, each line is formed to have double layered structure so the thickness of the lines would be thicker than the related art. Particularly, the additional data line ADL, the additional gate line AGL, and the additional common line ACL are included. The additional data line ADL is made of a gate metal material that is also used to form the gate line GL and the common line CL. The additional gate line AGL and the additional common line ACL are made of a data metal material that is also used to form the data line DL.

According to the currently used technology, the maximum thickness of a metal layer by depositing the gate metal material and/or the data metal material is about 4,000~8,000 Å with ensuring the uniformity of the metal layer. Therefore, when the bus lines (gate line GL, common line CL or data line DL) are formed as the single layer structure, the maximum thickness of the bus line would be 8,000 Å.

In the present disclosure, by making the thickness of the bus lines be thicker rather than widening the width, we suggest a thin film transistor substrate having low line resistance with keeping the aperture ratio from being lowered. For example, the gate line GL and the common line CL are formed as having 8,000 Å thickness (the maximum thickness of single metal layer) with the gate metal material. The additional data line ADL is also formed with the gate metal material where the data line DL will later be formed. As the data line DL crosses the gate line GL, the additional data line ADL should be formed as having a multiple segments disconnected along to the data line DL and disposed between the each gate lines GL running to horizontal direction or between the gate lines GL and the common lines CL. This prevents the segments of the ADL from physically contacting or electrically coupling to the gate line GL or common line CL, particularly where the gate line and data line cross each other.

After that, using the data metal material, the data line DL is formed with 8,000 Å thickness, the maximum thickness of single metal layer. Here, the data line DL should be stacked on the additional data line ADL so that these two layers are directly physically connected in addition to being electrically coupled. The additional data line ADL having 8,000 Å thickness and the data line DL having 8,000 Å thickness are stacked so that the total thickness of the whole data bus line would be 8,001-16,000 Å, in some cases twice the thickness of the data line DL alone. As the result, the line resistance of the data line DL can be lowered relative to an implementation lacking the ADL. Depending upon the embodiment, the ADL may be the same width as the DL, or slightly more or less wide than the DL.

When the data line DL is formed using the data metal material, the additional gate line AGL and the additional common line ACL are also formed with the data metal material. Both the AGL and ACL are formed to have a 8,000 Å thickness, and they are formed where the gate line GL and the common line CL are formed, respectively. The gate line GL having 8,000 Å thickness and the additional gate line AGL having 8,000 Å are stacked so that these two layers are directly physically connected in addition to being electrically coupled. Similarly, the common line CL having 8,000 Å thickness and the additional common line ACL having 8,000 Å are stacked so that these two layers are directly physically connected in addition to being electrically coupled. Consequently, the total thickness of the whole gate bus line and the whole common bus line would be 8,001-16,000 Å, in some cases twice the thickness of the gate line GL or common line CL alone. As the result, the line resistance of the gate line GL and the common line CL is lowered relatively to an implementation lacking the AGL and ACL. Further in an implementation including the ADL, AGL, and ACL, the width of the data line DL, gate line GL, and common line CL do not need to be widened to reduce resistance, and thus the aperture ratio is not reduced.

The gate line GL and the data line DL are crossing each other, and the common line CL and the data line DL are crossing each other. As the gate insulating layer GI is inserted between the gate line GL and the data line DL and between the common line CL and the data line DL at the crossing point. Particularly, a thin film transistor T is disposed at the crossing point between the gate line GL and the date line DL. Therefore, it is preferable that the gate insulating layer GI is disposed as covering the area where the thin film transistor T is formed. Further, it is preferable that the gate insulating layer GI may cover some portions of the one end of the additional data line ADL (closer to the thin film transistor T). If the gate insulating layer GI did not cover the end of the additional data line ADL, especially considering the margin for forming the gate insulating layer GI, the gate insulating layer GI would potentially be open at the end portions of the gate line GL. However, by depositing the data line DL on the gate insulating layer GI, the data line DL contacts the exposed portions of the gate line GL, thereby preventing accidental contact between the gate line GL and the data line DL.

It is preferable that the gate insulating layer GI may be disposed where the common line CL and the data line DL cross each other. Especially, the gate insulating layer GI may cover some portions of the other end of the additional data line ADL (far away from the thin film transistor T).

In the present disclosure, the gate insulating layer GI is disposed at the necessary areas including the crossing area between the gate line GL and the data line DL and between the common line CL and the data line DL and the area where the thin film transistor T is disposed. Therefore, most of all portions of the gate line GL, the common line CL and the additional data line ADL are exposed as not being covered by the gate insulating layer GI. As the result, the bottom surface of the additional gate line AGL stacking thereon contacts the upper surface of the gate line GL. Like that, the most of all surfaces of the additional common line ACL contact the most of all surface of the common line CL. Further, the additional data line DL contact in surface with the surface of the data line DL stacked on the additional data line ADL. The benefit of forming the gate insulating layers GI over portions of the substrate rather than over the entirety of the substrate (as is illustrated in FIGS. 1 and 2) is that it allows the later formed AGL, DL, and ACL (formed after the gate insulating layer GI) to physically and electrically contact the earlier formed GL, ADL, and CL, respectively (formed before the gate insulating layer GI). Forming the gate insulating layer GI in this manner also has the effect of ensuring that a portion of the data line DL that serves as the source of the thin film transistor is at an appropriate height in relation to the channel of the transistor (formed by a portion of the semiconductor layer SE) and in relation to the drain of the transistor.

The gate line GL and the data line DL may themselves have a multiple layer structure in which multiple metal layers or multiple alloy layers are stacked each other. For the large area display, the line resistance may be higher than that of the small area display. So, it is preferable that the bus line (e.g., the gate line bus, data line bus), and therefore the gate metal material and data metal material, includes a low resistance metal material such as the copper (Cu) or aluminum (Al). For example, either bus line may include a first metal layer including molybdenum-titanium alloy and the second metal layer having the copper stacked on the first metal layer. As the additional data line ADL and the additional gate line AGL are formed at the same layer and with the same metal material/s as the gate line GL and the data line DL, respectively, it is therefore also the case that the additional data line ADL and the additional gate line AGL may also have a stacked structure including multiple metal layers or multiple alloy layers. Depending upon the embodiment, the AGL and the ACL may be the same width as the GL and the CL, respectively, or they may be slightly more or less wide than the GL and the CL, respectively.

As the thin film transistor T is disposed where the gate line GL and the date line DL are crossing each other, it is preferable that the semiconductor layer SE is disposed and stacked on the gate insulating layer GI as having the same shape with the gate insulating layer GI. For this structure, we will explain in the method for manufacturing the thin film transistor substrate in detail.

Hereinafter, referring to FIGS. 4A to 4E, we will explain about a method for manufacturing the ultra high density thin film transistor substrate having the low resistance bus line structure according to the present disclosure. FIGS. 4A to 4E are cross-sectional views illustrating the steps of manufacturing for the ultra high density thin film transistor substrate of FIG. 1 by cutting along the line II-II', according to the present disclosure.

Figure 4A:
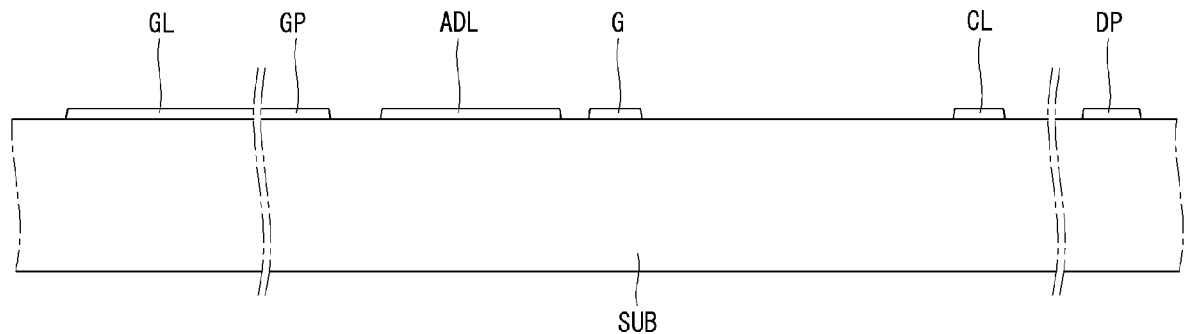
FIGS. 4A to 4E are cross-sectional views illustrating the steps of manufacturing for the ultra high density thin film transistor substrate of FIG. 1 by cutting along the line II-II', according to the present disclosure.

As shown in FIG. 4A, a gate metal material is deposited with thickness of 4,000~8,000 Å on the transparent substrate SUB. Patterning the gate metal material using the first mask process, the gate elements are formed. The gate elements include a gate line GL, a common line CL, a gate pad GP, a common pad CP, a gate electrode G and an additional data line ADL. The gate line GL and the common line CL may run to the horizontal direction on the substrate SUB. The gate pad GP is formed at one end of the gate line GL. The common pad CP is formed at one end of the common line CL. The gate electrode G may be branched from the gate line GL where the gate line GL and the data line are crossing each other. The additional data line ADL is disposed between the gate line GL and the common line CL. The additional data line ADL has a segment shape being apart from the gate line GL and the common line CL and running to vertical direction on the substrate. The additional data line ADL is formed and is physically connected with the data line DL such that it is electrically and physically isolated from the gate line GL and the common line CL.

Figure 4B:
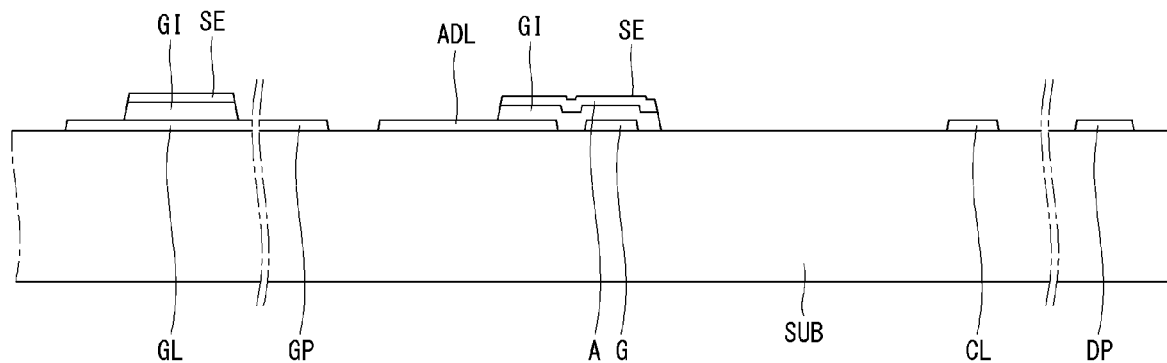

As shown in FIG. 4B, on the substrate having the gate elements, a gate insulating material and a semiconductor material are sequentially deposited. By patterning the gate insulating material and the semiconductor material at the same time using the second mask process, a gate insulating layer GI and a semiconductor layer SE are formed. The gate insulating layer GI and the semiconductor layer SE are disposed where a thin film transistor T is formed and where the data line DL crosses with the gate line GL or the common line CL. For example, they may cover the gate electrode G thoroughly and some portions of both ends of the additional data line ADL. However, this overlap by the gate insulating layer GI and the semiconductor layer SE covers (is stacked on top of) less than a majority of the gate line GL, the common line CL and the additional data line ADL.

In a more specific embodiment (not shown), the semiconductor layer SE may be disposed only where the thin film transistor T is formed. For example, at the crossing point where the common line CL and the data line DL are crossing each other, only the gate insulating layer GI is disposed without the semiconductor layer SE. At the crossing point where the gate line GL and the data line DL are crossing each other, the gate insulating layer GI and the semiconductor layer SE are disposed as being stacked. To do so, the second mask process may use a half-tone mask or a slit mask.

Returning to the example embodiment illustrated in FIGS. 4A-4E, the gate insulating layer GI and the semiconductor layer SE are disposed at the both areas where the common line CL and the data line DL are crossing each other and where the gate line GL and the data line DL are crossing each other. In this case, it is preferable that the semiconductor layer SE has the smaller size than that of the gate insulating layer GI. To do so, when selecting the etching material in the second mask process, it is preferable to consider the etching material having the etching ratio to the semiconductor material larger than the etching ratio to the gate insulating material.

Figure 4C:
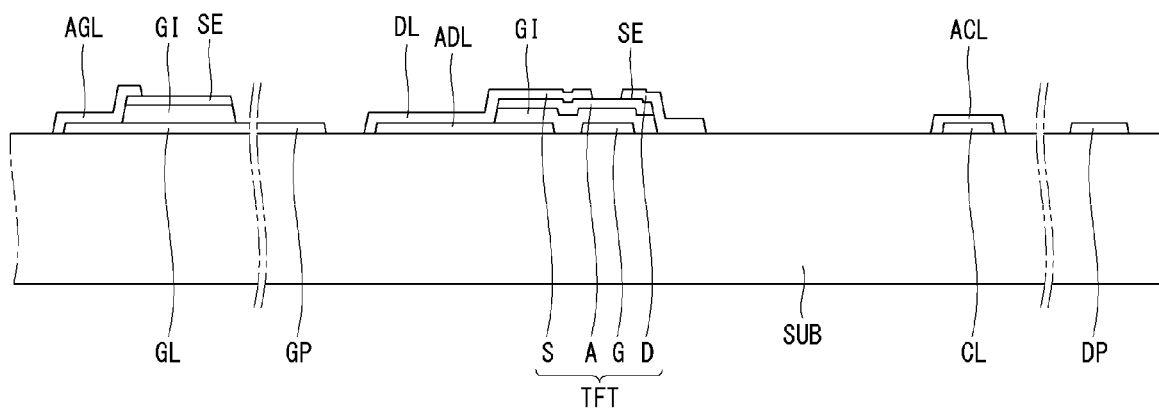

As shown in FIG. 4C, on the substrate SUB having the gate insulating layer GI and the semiconductor layer SE patterned in the island shape, a data metal material is deposited with the thickness of 4,000~8,000 Å. Patterning the data metal material using the third mask process, the data elements are formed. The data elements include a data line DL, a data pad DP, a source electrode S, a drain electrode D, an additional gate line AGL and an additional common line ACL. The data line DL runs to the vertical direction on the substrate SUB and is in surface contact with the additional data line ADL which the multiple segments are disposed in a line. Therefore, the data line DL is crossing with the gate line GL and the common line CL on the gate insulating layer GI and the semiconductor layer SE covering some of the gate line GL and the common line CL. The data pad DP is formed at one end of the data line DL. The source electrode S is branched from the data line DL and contacting on the one side of the semiconductor layer SE. The drain electrode D is contacting on the other side of the semiconductor layer Se, and apart from the source electrode S with a predetermined distance. The portions of the semiconductor layer SE between the source electrode S and the drain electrode D is defined as the channel area A. So, the thin film transistor T including the gate electrode G, the semiconductor channel area A, the source electrode S and the drain electrode D is completed. The additional gate line AGL is in surface contact with the gate line GL which is not covered by the gate insulating layer GI and the semiconductor layer SE. Likewise, the additional common line ACL is in surface contact with the common line CL which is not covered by the gate insulating layer GI and the semiconductor layer SE.

Figure 4D:
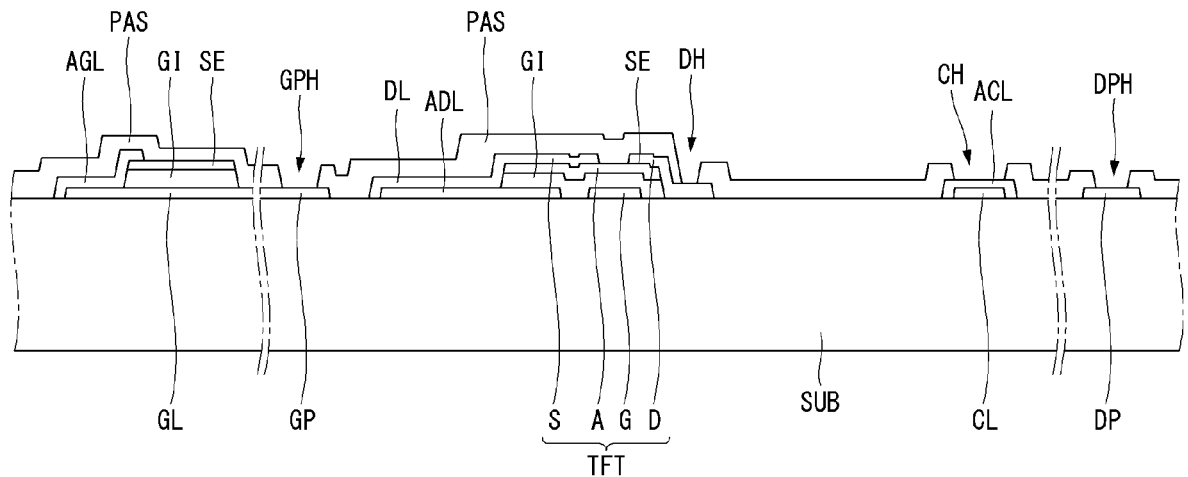

As shown in FIG. 4D, depositing an insulating material such as silicon nitride (SiNx) or silicon oxide (SiOx) on the whole surface of the substrate SUB having the data elements, a passivation layer PAS is deposited. Patterning the passivation layer PAS using the fourth mask process, contact holes are formed. The contact holes include a drain contact hole DH, a gate pad contact hole GPH, a common line contact hole CH, a data pad contact hole DPH. The drain contact hole DH exposes some portions of the drain electrode D. The gate pad contact hole GPH exposes some portions of the gate pad GP. The common line contact hole CH exposes some portions of the common line CL. The data pad contact hole DPH exposes some portions of the data pad DP.

Figure 4E:
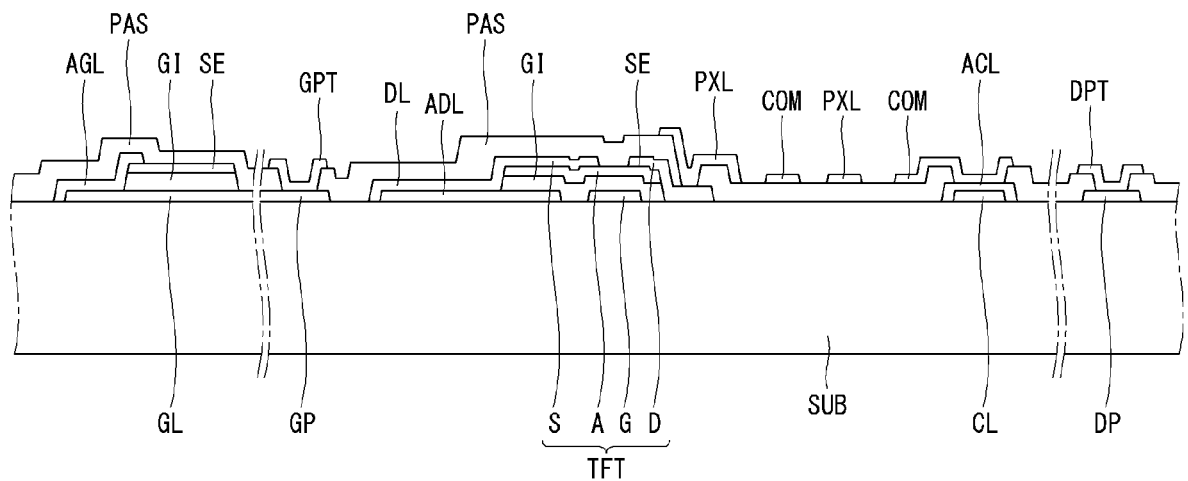

As shown in FIG. 4E, on the passivation layer PAS having the contact holes, an electrode material is deposited. The electrode material may include a transparent conductive material such as indium-tin-oxide (ITO) and indium-zinc-oxide (IZO). In some cases, the electrode material may include an opaque conductive material such as molybdenum (Mo), titanium (Ti) or molybdenum-titanium ally (MoTi). Patterning the electrode material using the fifth mask process, a pixel electrode PXL, a common electrode COM, a gate pad terminal GPT, and a data pad terminal DPT are formed. The pixel electrode PXL connects to the drain electrode D through the drain contact hole DH, and has a plurality of segments arrayed in parallel in one pixel area. The common electrode COM connects to the common line CL through the common line contact hole CH, and has a plurality of segments arrayed in parallel with each segment of the pixel electrode PXL. The gate pad terminal GPT connects to the gate terminal GP through the gate pad contact hole GPH. The data pad terminal DPT connects to the data terminal DP through the data pad contact hole DPH.

In the present disclosure, the gate line GL is in surface contact with the additional gate line AGL in which the top surface of the gate line GL is in surface contact with the bottom surface of the additional gate line AGL. Particularly, a majority of the bottom surface of the additional gate line AGL is in physical contact with the majority of the top surface of the gate line GL. A series of additional gate lines AGLs are disposed along the length of the gate line GL. As an added benefit, as the additional gate line AGL can be formed when the data line DL is formed, it can be formed without any additional mask process.

Likewise, the data line DL is in surface contact with the additional data line ADL in which the bottom surface of the data line DL is in surface contact with the top surface of the additional data line ADL. Particularly, a majority of the top surface of the additional data line ADL is in physical contact with a majority of the bottom surface of the data line DL. A series of additional data lines ADLs are disposed along the length of the data line DL. As an additional benefit, as the additional data line ADL can be formed when the gate line GL is formed, it can be formed without any additional mask process.

Consequently, with the same width of the bus line, the line resistance can be reduced by thickening the thickness of the bus line. For example, in the currently used TV panel over 45 inch diagonal length, the pixel density is about 40 PPI at maximum, the width of the gate line GL is 60 μm and the width of the data line DL is 10 μm. In order to design and manufacture an ultra-high density flat panel display having over 90 PPI in the TV panel over 45 inch diagonal length, the width of the gate line GL would be 40 μm and the width of the data line would be 5 μm. When the widths of the lines are narrowed like that, the line resistance would be remarkably increased so that it is hard to represent good video data. According to the present disclosure, even though the widths of the lines are narrowed, the thicknesses of the lines would be increased. Therefore, the line resistance may not be increased and better quality of the video data can be ensured.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A display device comprising:
   a substrate having a first area, and a second area outside of the first area, the second area including a link area and a pad area outside of the link area;
   gate lines and data lines crossing each other, and thin film transistors adjacent to crossings of the gate lines and the data lines in the first area, each of the thin film transistors including a source electrode, a semiconductor channel layer and a drain electrode;
   a first line extended from each of the gate lines and an additional gate line formed of a same material as the data lines in the link area, the additional gate line being contacted with the first line in the link area; and
   a gate pad extended from each of the first lines and a gate pad terminal on the gate pad, in the pad area, wherein at least a portion of the additional gate line directly contacts at least a portion of a top surface of a semiconductor layer formed of a same material as the semiconductor channel layer.

2. The display device of claim 1, further comprising;
   an additional data line positioned on a same layer as the gate line to be separated from the gate line;
   a data pad extended from the additional data line, in the pad area; and
   a data pad terminal on the data pad, in the pad area.

3. The display device of claim 2, wherein the gate pad terminal and the data pad terminal are formed of a same material.

4. The display device of claim 1, further comprising the semiconductor layer on a gate insulating layer covering the first line in the pad area, wherein the additional gate line is connected to a surface of the first line and a side of at least one of the first line and the semiconductor layer.

5. The display device of claim 4, further comprising a common line, and an additional data line positioned on a same layer as the gate line to be separated from the gate line.

6. The display device of claim 5, further comprising an additional common line on the common line in the first area, wherein the data line, the additional gate line, and the additional common line are formed of a same data material.

7. The display device of claim 6, wherein at a point where the common line and the data line cross each other, the gate insulating layer is formed and the semiconductor layer is not formed.

8. The display device of claim 6, wherein the gate insulating layer and the semiconductor layer are both formed at a point where the gate line and the data line cross each other.

9. The display device of claim 6, wherein the gate insulating layer is formed on a portion of the additional data line, the additional common line is in contact with a portion of the common line not covered by the gate insulating layer, and the data line is formed on a portion of the gate insulating layer formed on a portion of the additional data line.

10. The display device of claim 1, wherein the gate line and the data line are formed of a stacked structure comprising multiple metal layers, multiple alloy layers, or multiple layers including at least one metal layer and at least one alloy layer.

11. The display device of claim 10, wherein the stacked structure comprises a layer of molybdenum-titanium alloy and a layer of copper or aluminum.

12. The display device of claim 2, wherein the additional data line is formed in a plurality of segments along the data line, and wherein one of the segments is disposed between the gate line and an adjacent gate line or between the gate line and a common line.

13. The display device of claim 1, wherein a majority of a bottom surface of the additional gate line is in physical contact with a majority of a top surface of the gate line.

14. The display device of claim 2, wherein a majority of a bottom surface of the additional data line is in physical contact with a majority of a top surface of the data line.

15. The display device of claim 2, wherein the gate insulating layer covers less than a majority of the gate line, and the additional data line.

16. The display device of claim 1, wherein the additional gate line is positioned on the gate line not covered by a gate insulating layer covering the gate line, the data line and the gate electrode in the first area.

* * * * *